US010667345B2

(12) United States Patent
Oh et al.

(10) Patent No.: US 10,667,345 B2
(45) Date of Patent: May 26, 2020

(54) METHOD FOR MANUFACTURING LIGHT-EMITTING DEVICE PACKAGES, LIGHT-EMITTING DEVICE PACKAGE STRIP, AND LIGHT-EMITTING DEVICE PACKAGE

(71) Applicant: LUMENS CO., LTD., Yongin-si, Gyeonggi-do (KR)

(72) Inventors: Seung Hyun Oh, Gwangju-si (KR); Seung Hoon Lee, Yongin-si (KR); Sung Yole Yun, Yongin-si (KR); Jung A Lim, Yongin-si (KR); Sung Sik Jo, Jeollanam-do (KR); In Soo Kim, Suwon-si (KR); Tae Kyung Yoo, Seongnam-si (KR)

(73) Assignee: LUMENS CO., LTD., Yongin-si (KR)

( * ) Notice: Subject to any disclaimer, the term of this patent is extended or adjusted under 35 U.S.C. 154(b) by 129 days.

(21) Appl. No.: 15/896,706

(22) Filed: Feb. 14, 2018

(65) Prior Publication Data

US 2018/0177019 A1    Jun. 21, 2018

Related U.S. Application Data

(63) Continuation of application No. 14/830,032, filed on Aug. 19, 2015, now Pat. No. 9,930,750.

(30) Foreign Application Priority Data

Aug. 20, 2014  (KR) .................. 10-2014-0108346
Nov. 24, 2014  (KR) .................. 10-2014-0164363
Nov. 24, 2014  (KR) .................. 10-2014-0164364

(51) Int. Cl.
*H05B 33/22* (2006.01)
*H05B 33/10* (2006.01)
(Continued)

(52) U.S. Cl.
CPC ............... *H05B 33/22* (2013.01); *F21S 4/20* (2016.01); *F21S 4/24* (2016.01); *H01L 33/50* (2013.01);
(Continued)

(58) Field of Classification Search
CPC ....... F21S 4/20; F21S 4/24; H01L 2933/0033; H01L 2933/0041; H01L 2933/0066;
(Continued)

(56) References Cited

U.S. PATENT DOCUMENTS

2006/0261364 A1*  11/2006  Suehiro ................ H01L 33/56
                                                          257/100
2010/0283062 A1*  11/2010  Hsieh ................ H01L 21/6835
                                                          257/79
(Continued)

*Primary Examiner* — Tsion Tumebo
(74) *Attorney, Agent, or Firm* — Mei & Mark LLP

(57) ABSTRACT

Disclosed is a method for manufacturing a chip scale package (CSP) for a light-emitting diode (LED). The method may include a light-emitting device mounting step for mounting a plurality of light-emitting devices on a substrate strip, a phosphor forming step for forming a phosphor on the plurality of light-emitting devices, a reflective member forming step for forming a reflective member on the substrate strip to surround the phosphor, and a package singulation step for singulating unit packages by cutting the substrate strip and the reflective member.

16 Claims, 11 Drawing Sheets

(51) Int. Cl.
*H01L 33/50* (2010.01)
*H01L 33/60* (2010.01)
*F21S 4/20* (2016.01)
*H01L 33/62* (2010.01)
*F21S 4/24* (2016.01)

(52) U.S. Cl.
CPC ............ *H01L 33/60* (2013.01); *H05B 33/10* (2013.01); *H01L 33/62* (2013.01); *H01L 2933/0033* (2013.01); *H01L 2933/0041* (2013.01); *H01L 2933/0066* (2013.01)

(58) Field of Classification Search
CPC ......... H01L 33/50; H01L 33/60; H01L 33/62; H05B 33/10; H05B 33/22
See application file for complete search history.

(56) References Cited

U.S. PATENT DOCUMENTS

| | | | |
|---|---|---|---|
| 2012/0018754 A1* | 1/2012 | Lowes | F21V 3/12 257/98 |
| 2013/0001633 A1* | 1/2013 | Imai | H01L 33/60 257/99 |
| 2013/0149508 A1* | 6/2013 | Kwak | H01L 33/505 428/201 |
| 2013/0288407 A1* | 10/2013 | Lo | H01L 33/52 438/27 |
| 2014/0001504 A1* | 1/2014 | Lin | H01L 33/60 257/98 |
| 2014/0061698 A1* | 3/2014 | Lin | H01L 24/97 257/98 |
| 2014/0291705 A1* | 10/2014 | Kwak | H01L 33/50 257/88 |
| 2014/0295593 A1* | 10/2014 | Tseng | H01L 33/504 438/27 |

* cited by examiner

METHOD FOR MANUFACTURING LIGHT-EMITTING DEVICE PACKAGES, LIGHT-EMITTING DEVICE PACKAGE STRIP, AND LIGHT-EMITTING DEVICE PACKAGE

CROSS-REFERENCE TO RELATED PATENT APPLICATION

This application claims the benefit of Korean Patent Application Nos. 10-2014-0108346, filed on Aug. 20, 2014, 10-2014-0164363, filed on Nov. 24, 2014, and 10-2014-0164364, filed on Nov. 24, 2014, in the Korean Intellectual Property Office, respectively, the disclosure of which is incorporated herein in its entirety by reference.

BACKGROUND

1. Field

The present invention relates to a method for manufacturing light-emitting device packages, a light-emitting device package strip, and a light-emitting device package and, more particularly, to a method for manufacturing light-emitting device packages usable in a display apparatus or a lighting apparatus, a light-emitting device package strip, and a light-emitting device package.

2. Description of the Related Art

A light-emitting diode (LED) refers a type of semiconductor element capable of displaying light of various colors by providing a light-emitting source using a PN diode of a compound semiconductor. The LED has a long life, a small size, and a small weight, and can be driven using a low voltage. In addition, the LED is durable against impact and vibration, does not require preheating or complicated driving, and is mountable on a substrate or a lead frame in various forms before packaging. As such, the LED may be modularized for various purposes.

In general, a method for manufacturing a light-emitting device package includes mounting a light-emitting device on a lead frame, forming a reflective member, and then forming an optical conversion member on the light-emitting device.

However, according to the above conventional light-emitting device package manufacturing method, since light-emitting devices are separately mounted on substrates and a reflective member and an optical conversion member are formed on each of the light-emitting devices, a lot of time and cost are required for a packaging process, the price of products are increased, and thus productivity is reduced. As such, the manufactured light-emitting device packages have a relatively large size or thickness and thus small and thin products cannot be manufactured.

Furthermore, according to the conventional light-emitting device package manufacturing method, since optical members are separately provided on light-emitting devices, a performance difference occurs among the manufactured light-emitting device packages.

In addition, according to the conventional light-emitting device package manufacturing method, a substrate strip is deformed during the light-emitting device packages are manufactured.

SUMMARY

The present invention provides a method capable of manufacturing a large number of light-emitting device packages through a simple process, reducing the price of products, improving productivity, manufacturing small and thin products, and lowering a performance difference among manufactured products.

The present invention also provides a method capable of preventing deformation of a substrate strip during light-emitting device packages are manufactured, lowering an error rate, greatly reducing process time and cost, improving productivity, manufacturing small and thin products, and lowering a performance difference among manufactured products.

However, the scope of the present invention is not limited thereto.

According to an aspect of the present invention, there is provided a method for manufacturing light-emitting device packages, the method including a light-emitting device mounting step for mounting a plurality of light-emitting devices on a substrate strip, a phosphor forming step for forming a phosphor on the plurality of light-emitting devices, a reflective member forming step for forming a reflective member on the substrate strip to surround the phosphor, and a package singulation step for singulating unit packages by cutting the substrate strip and the reflective member.

In the phosphor forming step, the phosphor may be squeeze-printed on the substrate strip and the light-emitting devices using a mask, and, in the reflective member forming step, reflective member accommodation cavities may be formed by disposing a plate mold on an upper surface of the phosphor to surround the phosphor, and a molding material may be filled in the reflective member accommodation cavities.

In the phosphor forming step, phosphor accommodation cavities may be formed by disposing a mold on the light-emitting devices, and the phosphor may be filled in the phosphor accommodation cavities.

In the package singulation step, the reflective member and the substrate strip may be cut along cutting lines.

In the phosphor forming step, the phosphor may be coated on whole surfaces of the light-emitting devices and the substrate strip, the method may further include a reflective member accommodation cavity forming step for forming reflective member accommodation cavities by cutting or etching parts of the phosphor, after the phosphor forming step, and, in the reflective member forming step, a molding material may be filled in the reflective member accommodation cavities.

The method may further include a reflective member curing step for curing the reflective member to harden the reflective member, after the reflective member forming step.

The method may further include a supporting member forming step for forming a supporting member under the substrate strip to support the substrate strip.

The supporting member forming step may include a light-transmitting glass preparing step for preparing a light-transmitting glass, a UV adhesive coating step for coating a UV adhesive on the substrate strip and the light-transmitting glass to adhere the substrate strip to the light-transmitting glass, and a substrate strip fixing step for temporarily fixing the substrate strip onto the light-transmitting glass, and the package singulation step may include a reflective member and substrate strip cutting step for cutting the reflective member and the substrate strip, a UV light projection step for projecting UV light onto the UV adhesive through the light-transmitting glass to eliminate an adhesive force of the UV adhesive, and a supporting member separation step for separating the substrate strip from the supporting member.

The supporting member forming step may include an insulator fixing step for fixing an insulator having provided a wiring layer thereon, under the substrate strip, a through hole forming step for forming through holes in the insulator, and a through electrode forming step for forming through electrodes in the through holes.

According to another aspect of the present invention, there is provided a light-emitting device package strip including a substrate strip, a plurality of light-emitting devices mounted on the substrate strip, a phosphor provided on the plurality of light-emitting devices, a reflective member provided to surround the phosphor, and a supporting member provided under the substrate strip to support the substrate strip.

The supporting member may be light-transmitting glass temporarily adhered using a UV adhesive to be separable from the substrate strip.

According to another aspect of the present invention, there is provided a light-emitting device package including a substrate, a light-emitting device mounted on the substrate, a phosphor provided on the light-emitting device, and a reflective member provided to surround the phosphor and having a first cut surface on a side surface thereof.

The substrate may be a lead frame having a first electrode provided at a side based on an electrode separation space, a second electrode provided at another side based on the electrode separation space, and a mounting surface provided to mount the light-emitting device thereon, and may have a second cut surface on a side surface thereof.

The first cut surface and the second cut surface may be located on the same plane.

The light-emitting device package may further include a supporting member provided under the substrate to support the substrate.

The substrate may have a second cut surface on a side surface thereof, and the supporting member may further include an insulator fixed under the substrate and having a third cut surface, through electrodes penetrating through the insulator, and a rear wiring layer connected to the through electrodes and having a fourth cut surface.

The first cut surface, the second cut surface, the third cut surface, and the fourth cut surface may be located on the same plane.

The light-emitting device package may include side electrodes provided on side surfaces of the substrate and the supporting member.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION

Hereinafter, the present invention will be described in detail by explaining embodiments of the invention with reference to the attached drawings.

A chip scale package (CSP) is a high power package regarded as a next-generation light source in addition to a wafer level package (WLP), a laminated ceramic package, a multi-chip package, a metal package, and a chip on board (COB). Compared to conventional light-emitting device packages, the CSP is producible in a small size at a high density. As such, the CSP may be produced at a low cost through a simple process, and have a high heat resistance and an excellent color uniformity.

The CSP corresponds to a technology of providing a light-emitting device package on a chip scale, and is characterized in that a large number of light-emitting devices are mounted on a substrate strip, a phosphor is coated simultaneously on the light-emitting devices, and then packages are singulated.

Accordingly, the CSP has a size similar to or slightly greater than that of the light-emitting device. This package does not require an additional submount or substrate, and may be directly connected to a board.

Furthermore, as a surface mount device having PN junction, the CSP has a simple bonding pad space and thus a standard test may be taken thereon without an additional complicated process.

Figure 16:
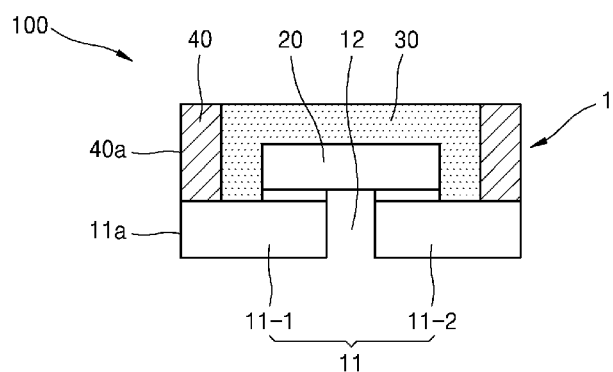
FIG. 16 is a cross-sectional view of a light-emitting device package according to some embodiments of the present invention.

FIG. 16 is a cross-sectional view of a light-emitting device package 100 according to some embodiments of the present invention.

As illustrated in FIG. 16, the light-emitting device package 100 according to some embodiments of the present invention may include a substrate 11, a light-emitting device 20, a phosphor 30, and a reflective member 40.

For example, as illustrated in FIG. 16, the light-emitting device package 100 may include the substrate 11, the light-emitting device 20 mounted on the substrate 11, the phosphor 30 provided on the light-emitting device 20, and the reflective member 40 provided to surround the phosphor 30 and having a first cut surface 40a on a side surface thereof.

For example, the substrate 11 may be formed of metal such as aluminum (Al), copper (Cu), zinc (Zn), tin (Sn), lead (Pb), gold (Au), or silver (Ag), and may be a lead frame having a form of a perforated or bent plate.

Instead of the lead frame, the substrate 11 may be a printed circuit board (PCB) produced by stacking a plurality of epoxy-based resin sheets on one another and forming a first electrode and a second electrode as a wiring layer. Alternatively, the substrate 11 may be a flexible printed circuit board (FPCB) formed of a flexible material.

Furthermore, as illustrated in FIG. 16, the substrate 11 may be a lead frame having a first electrode 11-1 provided at a side based on an electrode separation space 12, a second electrode 11-2 provided at another side based on the electrode separation space 12, and a mounting surface provided to mount the light-emitting device 20 thereon, and may have a second cut surface 11a on a side surface thereof.

Here, the first cut surface 40a and the second cut surface 11a may be located on the same plane.

Specifically, the light-emitting device package 100 according to some embodiments of the present invention is the above-described CSP product and may be manufactured using a light-emitting device package manufacturing method to be described below.

Accordingly, the light-emitting device package 100 may be appropriate for a high-power light-emitting device package due to high optical power and a high current density thereof, and may achieve high reliability because wire bonding is not necessary. Furthermore, the light-emitting device package 100 may have a high packaging density and have easy connectivity through surface mount technology.

In addition, the light-emitting device package 100 may be mass-produced through a simple process, and may have a high color uniformity because the phosphor 30 is coated simultaneously on a plurality of light-emitting devices 20 and thus the amount of the phosphor 30 does not greatly differ among the light-emitting devices 20.

Therefore, the light-emitting device package 100 according to some embodiments of the present invention may have a small and thin size close to a chip size, and achieve a high color uniformity compared to conventional light-emitting device packages.

Figure 1:
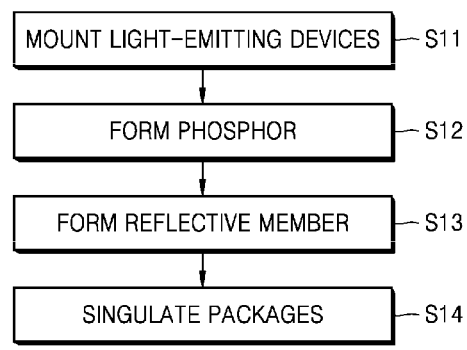
FIG. 1 is a flowchart of a method for manufacturing light-emitting device packages, according to some embodiments of the present invention.
Figure 7:
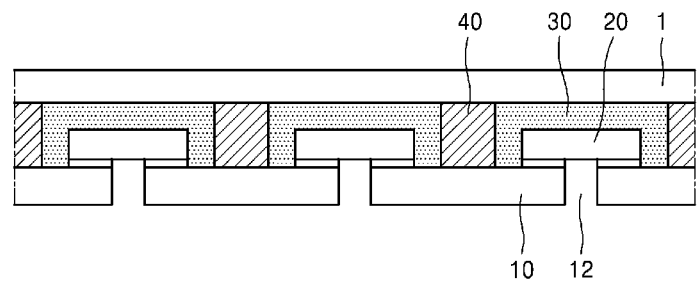
FIG. 7 is a cross-sectional view showing steps of the light-emitting device package manufacturing method of FIG. 1.
Figure 8:
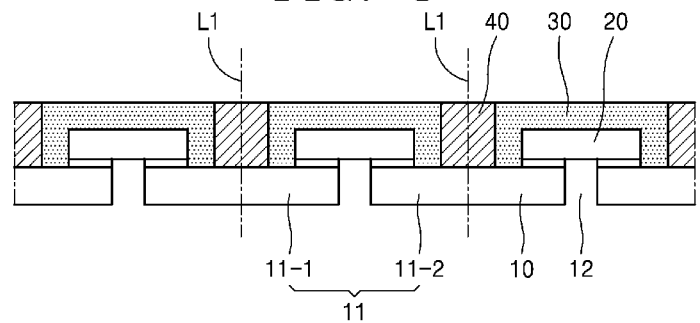
FIG. 8 is a cross-sectional view showing steps of the light-emitting device package manufacturing method of FIG. 1.
Figure 9:
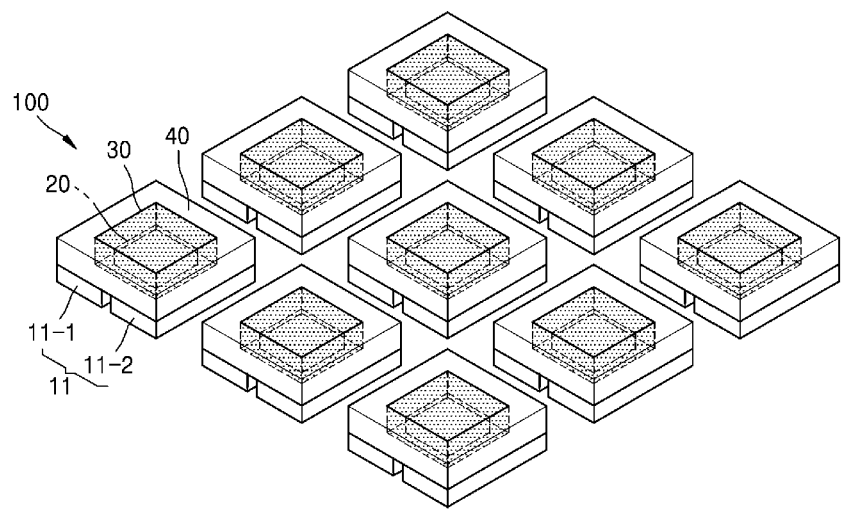
FIG. 9 is a perspective view showing a package singulation step of the light-emitting device package manufacturing method of FIG. 1.

FIG. 1 is a flowchart of a method for manufacturing light-emitting device packages, according to some embodiments of the present invention, FIGS. 2, 3, 4, 5, 6, 7 8, and 10 are cross-sectional views showing steps of the light-emitting device package manufacturing method of FIG. 1, and FIG. 9 is a perspective view showing a package singulation step S14 of the light-emitting device package manufacturing method of FIG. 1.

As illustrated in FIGS. 1 to 10, the light-emitting device package manufacturing method according to some embodiments of the present invention may include a light-emitting device mounting step S11 for mounting the light-emitting devices 20 on the substrate strip 10, a phosphor forming step S12 for forming the phosphor 30 on the light-emitting devices 20, a reflective member forming step S13 for forming the reflective member 40 on the substrate strip 10 to surround the phosphor 30, and the package singulation step S14 for singulating unit packages by cutting the substrate strip 10 and the reflective member 40.

Figure 2:
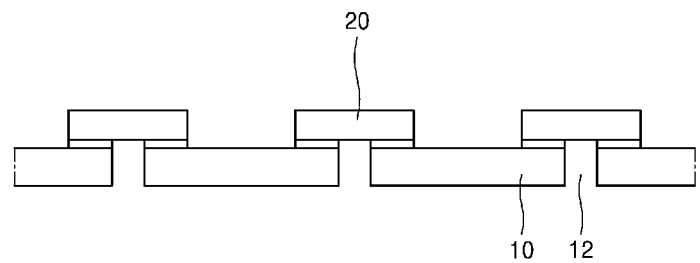
FIG. 2 is a cross-sectional view showing steps of the light-emitting device package manufacturing method of FIG. 1.

Here, in the light-emitting device mounting step S11, as illustrated in FIG. 2, the light-emitting devices 20 may be mounted on the substrate strip 10 in the form of flip chips. Specifically, the light-emitting devices 20 may be mounted on the substrate strip 10 by applying solder paste to one surface of the substrate strip 10, disposing the light-emitting devices 20 having electrode patterns at locations corresponding to the solder paste in such a manner that lower surfaces of the light-emitting devices 20 contact the solder paste, and performing a reflow process. In this case, the solder paste may be hardened after the reflow process to firmly fix the substrate strip 10 and the light-emitting devices 20 to each other.

The substrate strip 10 may include a plurality of substrate units, a plurality of substrate regions provided by the substrate units, and a plurality of electrode separation spaces 12 separately provided in the substrate regions. In this case, the electrode separation spaces 12 are cavities provided along a length direction of the substrate regions and may be filled with a molding material. Specifically, the electrode separation spaces 12 may be filled by injecting the molding material using a capillary phenomenon after the light-emitting devices 20 are mounted, or may be filled by squeeze-printing the molding material after the light-emitting devices 20 mounted and then the substrate strip 10 is turned over.

Figure 3:
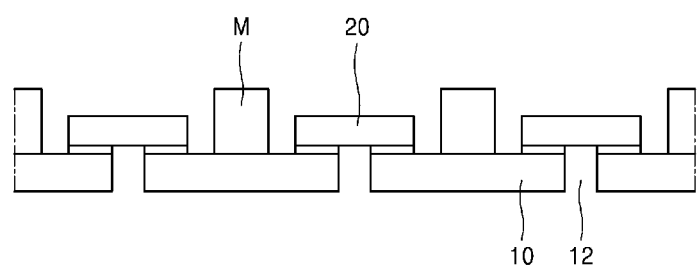
FIG. 3 is a cross-sectional view showing steps of the light-emitting device package manufacturing method of FIG. 1.
Figure 4:
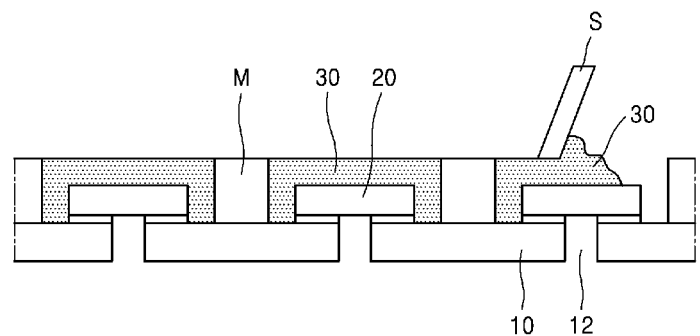
FIG. 4 is a cross-sectional view showing steps of the light-emitting device package manufacturing method of FIG. 1.
Figure 5:
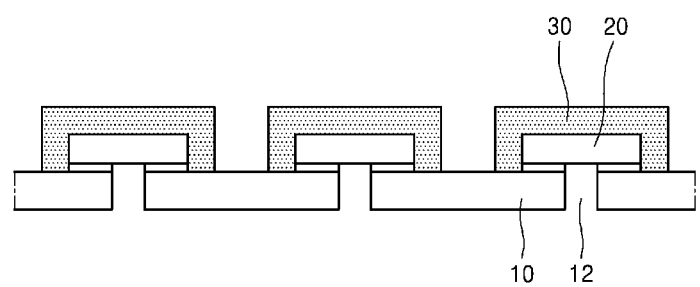
FIG. 5 is a cross-sectional view showing steps of the light-emitting device package manufacturing method of FIG. 1.

As illustrated in FIGS. 3, 4, and 5, in the phosphor forming step S12, the phosphor 30 may be squeeze-printed simultaneously on the substrate strip 10 and the light-emitting devices 20 using a mask M. For example, after the light-emitting device mounting step S11, the mask M may be disposed and then the phosphor 30 may be coated simultaneously on the light-emitting devices 20 using a squeezer S.

In this case, since the thickness of the phosphor 30 is adjustable by adjusting the height of the mask M, the thickness of the light-emitting device packages may be easily adjusted based on the type of a lighting apparatus.

Here, the squeezer S is a type of pressure forming tool capable of pressing the phosphor 30 to be uniformly filled in printing holes provided by the mask M. The squeezer S may be a horizontally moving squeezer as illustrated in FIG. 4, or a vertically moving squeezer like a piston. Alternatively, various printing rolls, injection devices, sprays, and inkjet printer components may be used.

For example, the phosphor 30 may be filled in a fluid state and then hardened, and may have a composition and a color as described below.

The phosphor 30 may include a material such as quantum dots (QDs), and the phosphor 30 and/or the QDs may be used in combination or solely.

Figure 10:
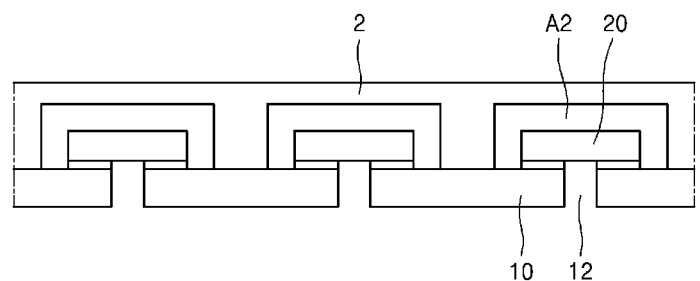
FIG. 10 is a cross-sectional view showing a phosphor forming step of the light-emitting device package manufacturing method of FIG. 1.

Alternatively, in the phosphor forming step S12, as illustrated in FIG. 10, phosphor accommodation cavities A2 may be formed by disposing a mold 2 on the light-emitting devices 20, and the phosphor 30 may be filled in the phosphor accommodation cavities A2. In this case, since the thickness of the phosphor 30 is adjustable by adjusting the mold 2, the thickness of the light-emitting device packages may be easily adjusted based on the type of a lighting apparatus.

Accordingly, since the phosphor 30 is coated simultaneously on the light-emitting devices 20, the phosphor 30 may be coated uniformly on the light-emitting devices 20 compared to a case in which a phosphor is coated separately on light-emitting devices, and thus light-emitting device packages having improved color uniformity may be manufactured.

Figure 6:
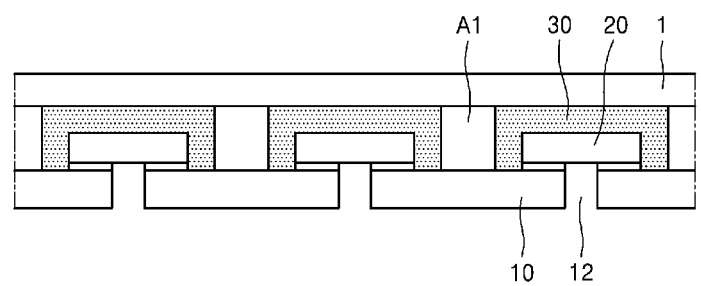
FIG. 6 is a cross-sectional view showing steps of the light-emitting device package manufacturing method of FIG. 1.

In the reflective member forming step S13, as illustrated in FIGS. 6 to 8, reflective member accommodation cavities A1 may be formed by disposing a plate mold 1 on an upper surface of the phosphor 30 to surround the phosphor 30, and a molding material may be filled in the reflective member accommodation cavities A1.

Here, the molding material may include at least one selected from the group consisting of epoxy resin composition, silicone resin composition, modified epoxy resin composition, modified silicone resin composition, polyimide resin composition, modified polyimide resin composition, modified polyimide resin composition, polyphthal-amide (PPA), polycarbonate resin, polyphenylene sulfide (PPS), liquid crystal polymer (LCP), acrylonitrile butadiene styrene (ABS) resin, phenolic resin, acrylic resin, polybutylene terephthalate (PBT) resin, and combinations thereof. These resins may contain a light-reflecting material such as titanium oxide, silicon dioxide, titanium dioxide, zirconium dioxide, potassium titanate, alumina, aluminum nitride, boron nitride, mullite, chromium, or a white-based or metal-based component.

The reflective member 40 may be formed of the molding material including at least one selected from the group consisting of epoxy molding compound (EMC) including a reflective material, white silicone including a reflective material, photoimageable solder resist (PSR), and combinations thereof.

Accordingly, the reflective member 40 is formed to surround the phosphor 30, and may adjust optical paths in such a manner that light generated by the light-emitting devices 20 proceeds upward from the light-emitting devices 20 through the phosphor 30.

In the package singulation step S14, as illustrated in FIGS. 8 and 9, the reflective member 40 and the substrate strip 10 may be cut along cutting lines L1 and L1 using the rotation of a cutting blade or a shearing force of a cutter. Here, the cutting lines L1 and L1 are arbitrary lines for splitting the reflective member 40 in a first direction and may be changed as necessary to adjust the width of the cut pieces of the reflective member 40, or changed to adjust the size of unit packages.

Here, for example, the cutting blade may rotate and cut the reflective member 40 and the substrate strip 10 at least once in the horizontal and vertical directions, thereby manufacturing a plurality of unit packages. The cutter may include a plurality of cutting blades as a unit and thus cut the reflective member 40 and the substrate strip 10 in the horizontal and vertical directions at the same time, thereby manufacturing a plurality of unit packages.

Accordingly, a plurality of unit packages having a small performance difference among products may be manufactured through a simple process.

Figure 11:
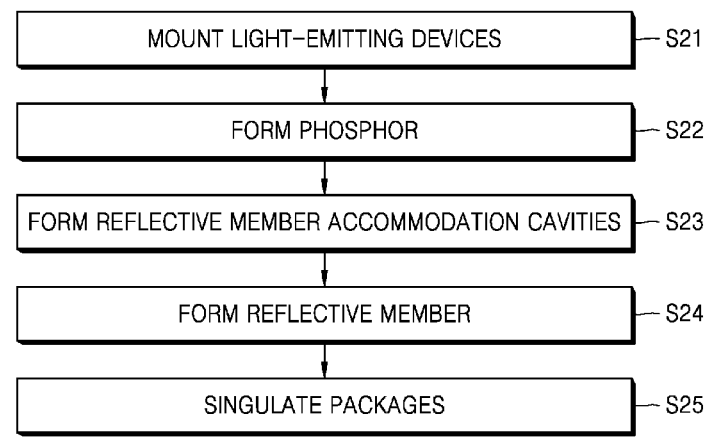
FIG. 11 is a flowchart of a method for manufacturing light-emitting device packages, according to other embodiments of the present invention.
Figure 12:
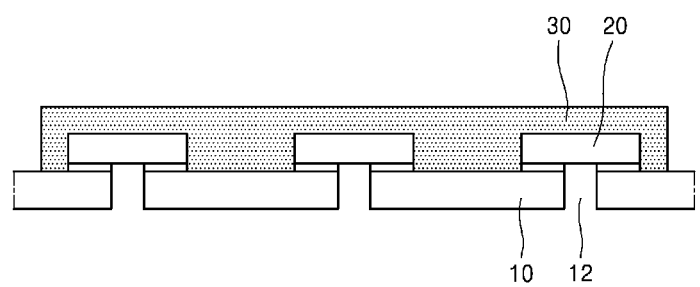
FIG. 12 is a cross-sectional view showing steps of the light-emitting device package manufacturing method of FIG. 11.
Figure 13:
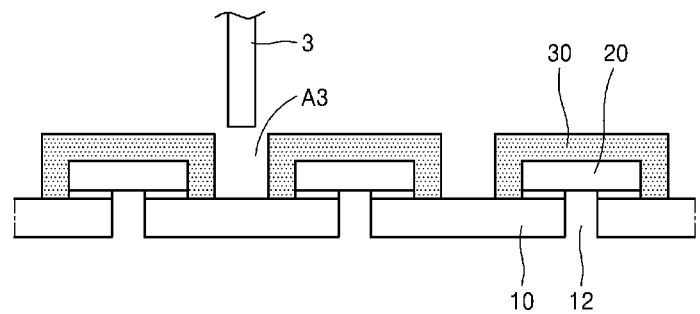
FIG. 13 is a cross-sectional view showing steps of the light-emitting device package manufacturing method of FIG. 11.
Figure 14:
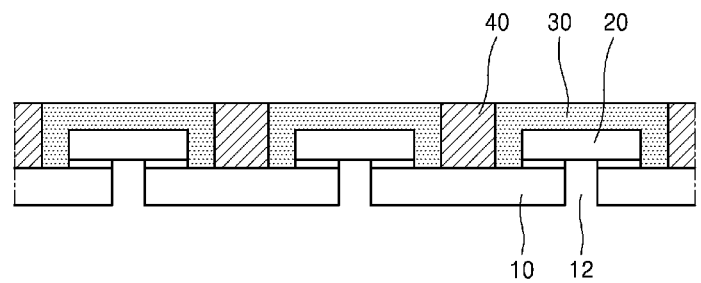
FIG. 14 is a cross-sectional view showing steps of the light-emitting device package manufacturing method of FIG. 11.

FIG. 11 is a flowchart of a method for manufacturing light-emitting device packages, according to other embodiments of the present invention, and FIGS. 12 to 14 are cross-sectional views showing steps of the light-emitting device package manufacturing method of FIG. 11.

As illustrated in FIGS. 11, 12, 13 and 14, the light-emitting device package manufacturing method according to other embodiments of the present invention may include a light-emitting device mounting step S21 for mounting the light-emitting devices 20 on the substrate strip 10, a phosphor forming step S22 for forming the phosphor 30 on the light-emitting devices 20, a reflective member forming step S24 for forming the reflective member 40 on the substrate strip 10 to surround the phosphor 30, and a package singulation step S25 for sigulating unit packages by cutting the substrate strip 10 and the reflective member 40.

As illustrated in FIGS. 12 and 13, in the phosphor forming step S22, the phosphor 30 is coated simultaneously on the whole surfaces of the light-emitting devices 20 and the substrate strip 10, and the light-emitting device package manufacturing method may further include a reflective member accommodation cavity forming step S23 for forming reflective member accommodation cavities A3 by cutting or etching parts of the phosphor 30, after the phosphor forming step S22. For example, a cutting blade 3 may rotate and cut the phosphor 30 to form the reflective member accommodation cavities A3 in the phosphor 30 in a length direction.

As illustrated in FIG. 14, in the reflective member forming step S24, a molding material may be filled in the reflective member accommodation cavities A3.

In this case, the molding material may be filled in a fluid state and then hardened into the reflective member 40.

The molding material may include at least one selected from the group consisting of EMC including a reflective material, white silicone including a reflective material, PSR, and combinations thereof.

Accordingly, the reflective member 40 is formed to surround the phosphor 30, and may adjust optical paths in such a manner that light generated by the light-emitting devices 20 proceeds upward from the light-emitting devices 20 through the phosphor 30.

Figure 15:
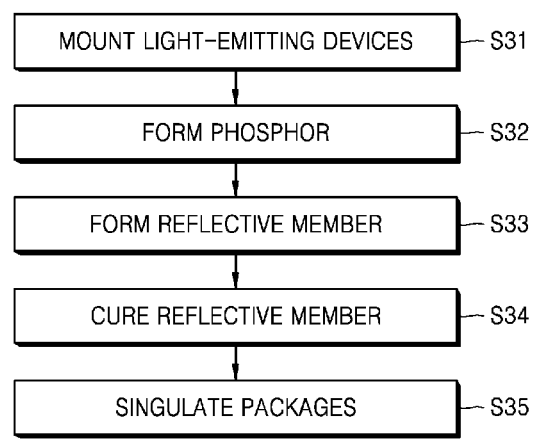
FIG. 15 is a flowchart of a method for manufacturing light-emitting device packages, according to still other embodiments of the present invention.

FIG. 15 is a flowchart of a method for manufacturing light-emitting device packages, according to still other embodiments of the present invention.

As illustrated in FIG. 15, the light-emitting device package manufacturing method according to still other embodiments of the present invention may include a light-emitting device mounting step S31 for mounting the light-emitting devices 20 on the substrate strip 10, a phosphor forming step S32 for forming the phosphor 30 on the light-emitting devices 20, a reflective member forming step S33 for forming the reflective member 40 on the substrate strip 10 to surround the phosphor 30, and a package singulation step S35 for singulating unit packages by cutting the substrate strip 10 and the reflective member 40, and may further include a reflective member curing step S34 for curing the reflective member 40 to harden the reflective member 40, after the reflective member forming step S33. Through the reflective member curing step S34, the reflective member 40 may be hardened to firmly fix the reflective member 40 and the substrate strip 10 to each other.

Figure 17:
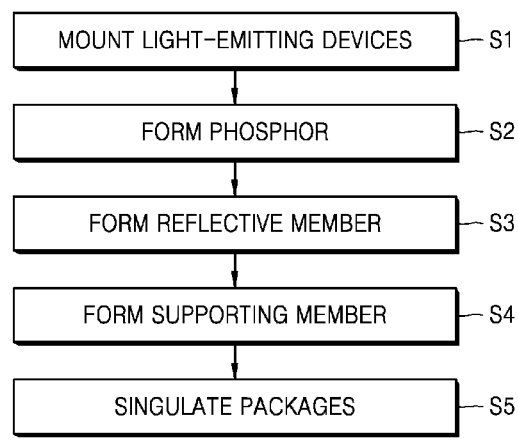
FIG. 17 is a flowchart of a method for manufacturing light-emitting device packages, according to some embodiments of the present invention.
Figure 20:
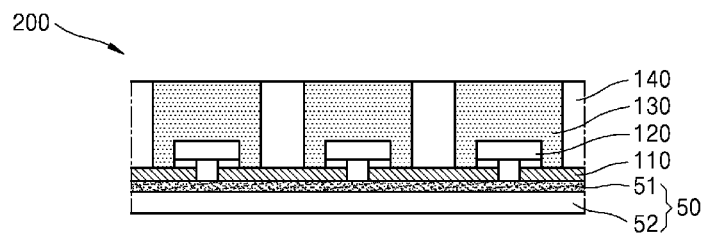
FIG. 20 is a cross-sectional view showing steps of the light-emitting device package manufacturing method of FIG. 18.
Figure 21:
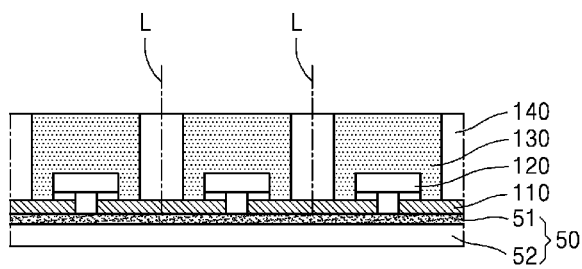
FIG. 21 is a cross-sectional view showing steps of the light-emitting device package manufacturing method of FIG. 18.
Figure 22:
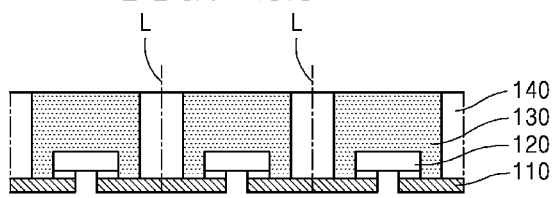
FIG. 22 is a cross-sectional view showing steps of the light-emitting device package manufacturing method of FIG. 18.
Figure 23:
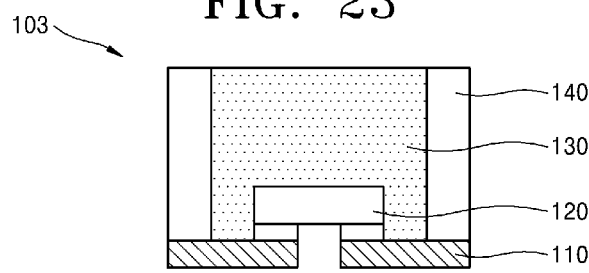
FIG. 23 is a cross-sectional view showing steps of the light-emitting device package manufacturing method of FIG. 18.

FIG. 20 is a cross-sectional view of a light-emitting device package strip 200, and FIG. 17 is a flowchart of a method for manufacturing light-emitting device packages, according to some embodiments of the present invention.

As illustrated in FIG. 20, the light-emitting device package strip 200 may include the substrate strip 110, the light-emitting devices 120, the phosphor 130, the reflective member 140, and a supporting member 50.

For example, as illustrated in FIG. 20, the light-emitting device package strip 200 may include the substrate strip 110, the light-emitting devices 120 mounted on the substrate strip 110, the phosphor 130 provided on the light-emitting devices 120, the reflective member 140 provided to surround the phosphor 130, and the supporting member 50 provided under the substrate strip 110 to support the substrate strip 110.

As illustrated in FIG. 17, the light-emitting device package manufacturing method according to some embodiments of the present invention may include a light-emitting device mounting step S1 for mounting the light-emitting devices 120 on the substrate strip 110, a phosphor forming step S2 for forming the phosphor 130 on the light-emitting devices 120, a reflective member forming step S3 for forming the reflective member 140 on the substrate strip 110 to surround the phosphor 130, a supporting member forming step S4 for forming the supporting member 50 under the substrate strip 110 to support the substrate strip 110, and a package singulation step S5 for singulating unit packages by cutting the substrate strip 110 and the reflective member 140.

Figure 18:
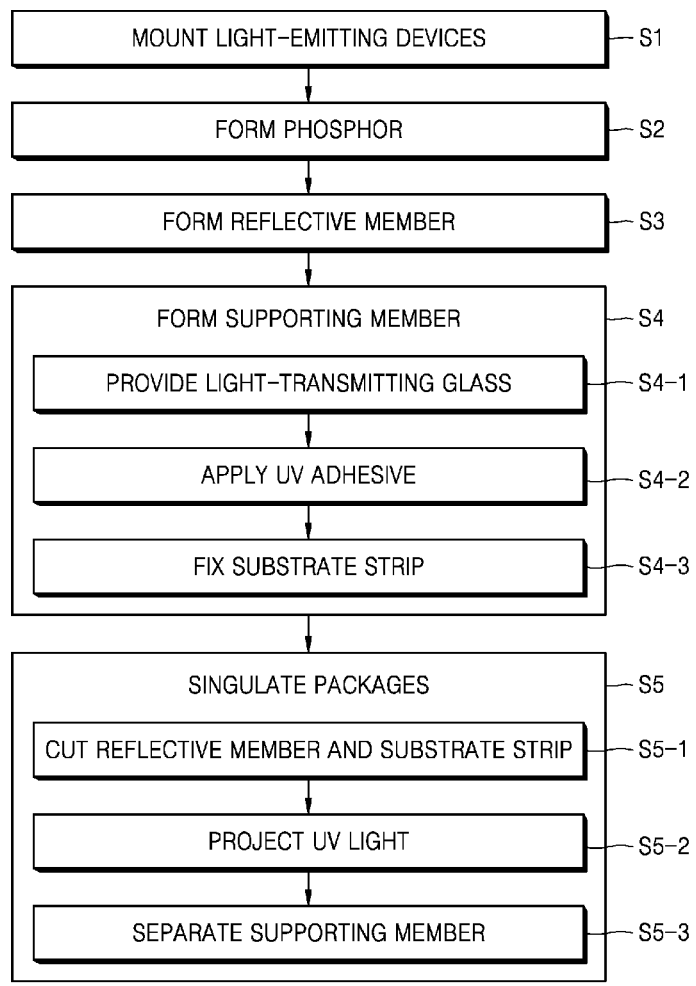
FIG. 18 is a flowchart of a method for manufacturing light-emitting device packages, according to other embodiments of the present invention.
Figure 19:
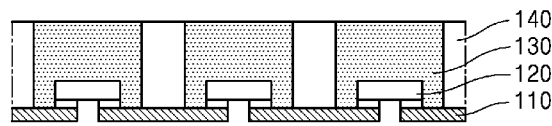
FIG. 19 is a cross-sectional view showing steps of the light-emitting device package manufacturing method of FIG. 18.

FIG. 18 is a flowchart of a method for manufacturing light-emitting device packages, according to other embodiments of the present invention, and FIGS. 19, 20, 21, 22 and 23 are cross-sectional views showing steps of the light-emitting device package manufacturing method of FIG. 18.

As illustrated in FIG. 18, a supporting member forming step S4 may include a light-transmitting glass preparing step S4-1 for preparing a light-transmitting glass 52, a UV adhesive coating step S4-2 for coating a UV adhesive 51 on the substrate strip 110 and the light-transmitting glass 52 to adhere the substrate strip 110 to the light-transmitting glass 52, and a substrate strip fixing step S4-3 for temporarily fixing the substrate strip 110 onto the light-transmitting glass 52.

A package singulation step S5 may include a reflective member and substrate strip cutting step S5-1 for cutting the reflective member 140 and the substrate strip 110, a UV light projection step S5-2 for projecting UV light onto the UV adhesive 51 through the light-transmitting glass 52 to eliminate an adhesive force of the UV adhesive 51, and a supporting member separation step S5-3 for separating the substrate strip 110 from the supporting member 50.

As illustrated in FIGS. 19 to 23, the light-emitting device package manufacturing method may include mounting the light-emitting devices 120 on the substrate strip 110, forming the phosphor 130 on the light-emitting devices 120, forming the reflective member 140 on the substrate strip 110 to surround the phosphor 130, forming the supporting member 50 under the substrate strip 110 to support the substrate strip 110, and cutting the substrate strip 110 and the reflective member 140.

In addition, the light-emitting device package manufacturing method may include preparing the light-transmitting glass 52, coating the UV adhesive 51 on the substrate strip 110 and the light-transmitting glass 52 to adhere the substrate strip 110 to the light-transmitting glass 52, temporarily fixing the substrate strip 110 onto the light-transmitting glass 52, cutting the reflective member 140 and the substrate strip 110 along the cutting lines L, projecting UV light onto the UV adhesive 51 through the light-transmitting glass 52 to eliminate an adhesive force of the UV adhesive 51, and separating the substrate strip 110 from the supporting member 50.

For example, the light-transmitting glass 52 may include various thermoplastic or thermosetting hardeners, e.g., epoxy resin, acrylic resin, polyester resin, urethane resin, silicone resin, rubber, polyimide resin, polyisoimide, isocyanate-based resin, melamine-based resin, acetone-based resin, phenon-based resin, polymer resin, and an optical coupling curing accelerator such as a UV curing agent. In addition, all types of insulating and heat-resistant resin may also be used.

Figure 24:
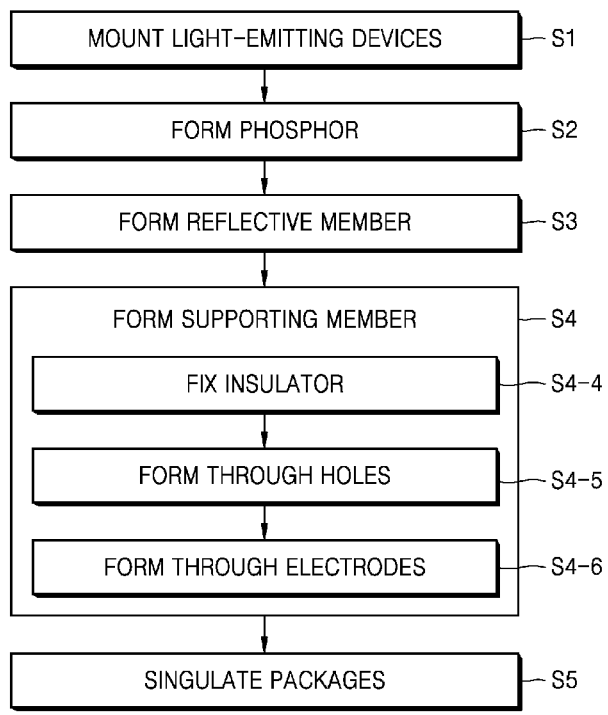
FIG. 24 is a flowchart of a method for manufacturing light-emitting device packages, according to still other embodiments of the present invention.
Figure 25:
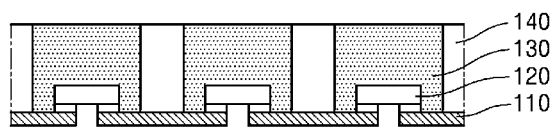
FIG. 25 is a cross-sectional view showing steps of the light-emitting device package manufacturing method of FIG. 24.
Figure 26:
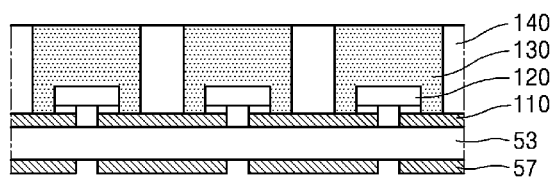
FIG. 26 is a cross-sectional view showing steps of the light-emitting device package manufacturing method of FIG. 24.
Figure 27:
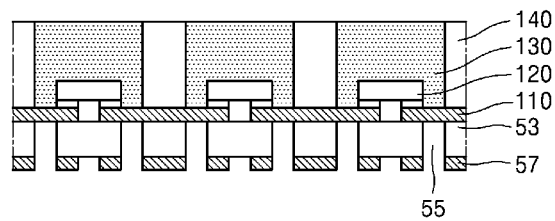
FIG. 27 is a cross-sectional view showing steps of the light-emitting device package manufacturing method of FIG. 24.
Figure 28:
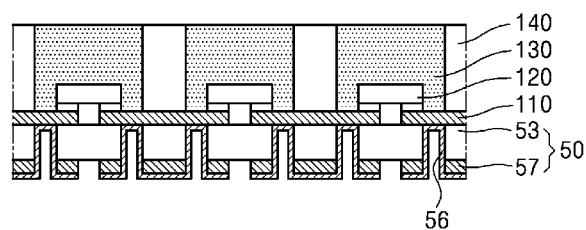
FIG. 28 is a cross-sectional view showing steps of the light-emitting device package manufacturing method of FIG. 24.
Figure 29:
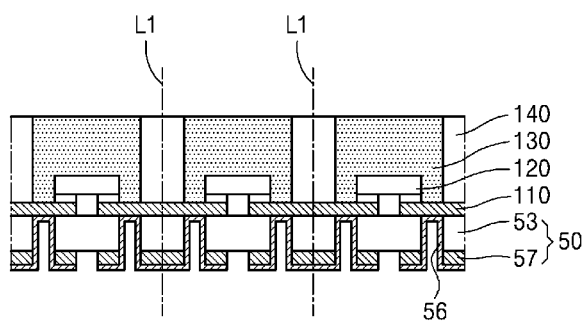
FIG. 29 is a cross-sectional view showing steps of the light-emitting device package manufacturing method of FIG. 24.
Figure 30:
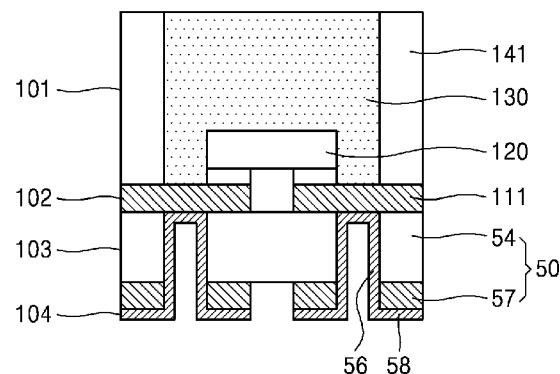
FIG. 30 is a cross-sectional view showing steps of the light-emitting device package manufacturing method of FIG. 24.

FIG. 30 is a cross-sectional view of a light-emitting device package 105 according to some embodiments of the present invention, FIG. 24 is a flowchart of a method for manufacturing light-emitting device packages, according to still other embodiments of the present invention, and FIGS. 25, 26, 27, 28 and 29 are cross-sectional views showing steps of the light-emitting device package manufacturing method of FIG. 24.

As illustrated in FIG. 30, the light-emitting device package 105 according to some embodiments of the present invention may include a substrate 111, the light-emitting device 120, the phosphor 130, a reflective member 141, the supporting member 50, an insulator 54, through electrodes 56, and a rear wiring layer 58.

For example, the light-emitting device package 105 according to some embodiments of the present invention may include the light-emitting device 120 mounted on the substrate 111, the phosphor 130 provided on the light-emitting device 120, the reflective member 141 provided to surround the phosphor 130 and having a first cut surface 101 on a side surface thereof, and the supporting member 50 provided under the substrate 111 to support the substrate 111.

The substrate 111 may have a second cut surface 102 on a side surface thereof, and the supporting member 50 may include the insulator 54 fixed under the substrate 111 and having a third cut surface 103, the through electrodes 56 penetrating through the insulator 54, and the rear wiring layer 58 connected to the through electrodes 56 and having a fourth cut surface 104.

The first cut surface 101, the second cut surface 102, the third cut surface 103, and the fourth cut surface 104 may be located on the same plane.

As illustrated in FIG. 24, the light-emitting device package manufacturing method may include an insulator fixing step S4-4 for fixing the insulator 53 having provided the rear wiring layer 58 thereon, under the substrate strip 110, a through hole forming step S4-5 for forming through holes 55 in the insulator 53, and a through electrode forming step S4-6 for forming the through electrodes 56 in the through holes 55.

As illustrated in FIGS. 25 to 29, the light-emitting device package manufacturing method may include mounting the light-emitting devices 120 on the substrate strip 110, forming the phosphor 130 on the light-emitting devices 120, forming the reflective member 140 on the substrate strip 110 to surround the phosphor 130, fixing the insulator 53 having provided the rear wiring layer 58 thereon, under the substrate strip 110, forming the through holes 55 in the insulator 53, forming the through electrodes 56 in the through holes 55, and cutting along the cutting lines L1.

The light-emitting device package 105 may include the reflective member 141 having the first cut surface 101, the substrate 111 having the second cut surface 102, the insulator 54 having the third cut surface 103, and the rear wiring layer 58 having the fourth cut surface 104.

The first cut surface 101, the second cut surface 102, the third cut surface 103, and the fourth cut surface 104 may be located on the same plane.

In the through electrode forming step S4-6, as illustrated in FIG. 12, the through electrodes 56 and the rear wiring layer 58 may be formed in the through holes 55 using a printing scheme such as jet printing or silk printing.

Accordingly, since the through electrodes 56 and the rear wiring layer 58 are formed using the same scheme, a manufacturing process may be simplified.

Figure 31:
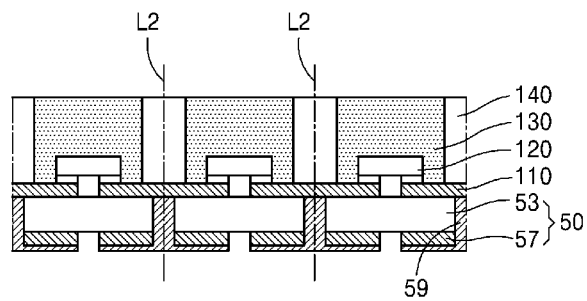
FIG. 31 is a cross-sectional view showing other steps of the light-emitting device package manufacturing method of FIG. 24.
Figure 32:
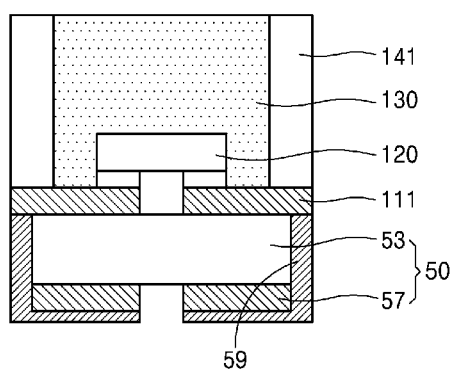
FIG. 32 is a cross-sectional view showing other steps of the light-emitting device package manufacturing method of FIG. 24.

FIG. 31 is a cross-sectional view of a light-emitting device package strip according to still other embodiments of the present invention, and FIG. 32 is a cross-sectional view of a light-emitting device package 107.

As illustrated in FIG. 31, the light-emitting device package strip including the light-emitting devices 120, the phosphor 130, the reflective member 140, and the substrate strip 110 including the through electrodes 56 and the rear wiring layer 58 may be cut along the cutting lines L2.

As illustrated in FIG. 32, the light-emitting device package strip may include the light-emitting device package 107 including the substrate 111 and side electrodes 59 provided on side surfaces of the supporting member 50.

For example, the light-emitting device 120 may be a light-emitting diode (LED) having a form of a flip chip electrically connected to the substrate 111 using a bonding medium.

The rear wiring layer 58 may include an electrically conductive material such as copper (Cu), nickel (Ni), aluminium (Al), chromium (Cr), Iron (Fe), tungsten (W), or an alloy thereof.

Although not shown in any drawing, the light-emitting device 120 may be provided in the form of a flip chip having a signal transfer medium such as bumps or solder. In addition, all light-emitting devices having terminals (partially) provided using bonding wire, all horizontal and vertical light-emitting devices, etc. may be used.

The substrate strip 110 includes a plurality of substrates 111, and may have various shapes.

A plurality of light-emitting devices 120 may be mounted on the substrate strip 110.

The light-emitting devices 120 may be formed of a semiconductor. For example, blue, green, red, and yellow LEDs, ultraviolet LEDs, and infrared LEDs formed of a semiconductor nitride may be used.

Meanwhile, the substrate 111 may be a metal substrate having a mounting surface for mounting the light-emitting device 20 thereon.

For example, the substrate 111 may be formed of an insulating or conductive material having a mechanical strength appropriate to support or accommodate the light-emitting device 120.

For example, the substrate 111 may be formed of metal such as Al, Cu, Zn, Sn, Pb, Au, or Ag, and may be have a form of a perforated or bent plate.

The substrate 111 may be a printed circuit board (PCB) produced by stacking a plurality of epoxy-based resin sheets on one another. Alternatively, the substrate 111 may be a flexible printed circuit board (FPCB) formed of a flexible material.

Instead of the substrate 111, a synthetic resin substrate formed of, for example, resin or glass epoxy may be used or a ceramic substrate may be used in consideration of heat conductivity.

To improve processability, the substrate 111 may be partially or entirely formed of at least one selected from the group consisting of EMC, polyimide (PI), ceramic, graphene, synthetic fiber glass, and combinations thereof.

The reflective member 140 is provided on the substrate strip 110 and may include a metallic heat radiation layer mounted on the substrate strip 110 to radiate heat generated from the light-emitting device 120.

The reflective member 140 may be formed of metal such as Al, Cu, Zn, Sn, Pb, Au, or Ag.

However, the reflective member 140 is not limited to the above metal and may be molded integrally with the substrate strip 110 to reflect light emitted from the light-emitting device 120. The reflective member 140 may be formed of at least one selected from the group consisting of EMC including a reflective material, white silicone including a reflective material, PSR, and combinations thereof.

These resins may contain a light-reflecting material such as titanium oxide, silicon dioxide, titanium dioxide, zirconium dioxide, potassium titanate, alumina, aluminum nitride, boron nitride, mullite, chromium, or a white-based or metal-based component.

As described above, using a method for manufacturing light-emitting device packages according to some embodiments of the present invention, a large number of light-emitting device packages may be manufactured through a simple process, the price of products may be reduced, and a performance difference among manufactured products may be lowered.

Therefore, the light-emitting device packages may have a small and thin size close to a chip size, and achieve a high color uniformity compared to conventional light-emitting device packages.

According to the above-described embodiments of the present invention, a large number of light-emitting device packages may be manufactured through a simple process, the price of products may be reduced, productivity may be improved, and the performance of products may be increased.

In addition, deformation of a substrate strip may be prevented during light-emitting device packages are manufactured, an error rate may be lowered, process time and cost may be greatly reduced, the price of products may be reduced, and thus productivity may be improved.

However, the scope of the present invention is not limited to the above effects.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method for manufacturing light-emitting device packages, the method comprising:
   a light-emitting device mounting step for mounting a plurality of light-emitting devices on a substrate strip;
   a phosphor forming step for forming a phosphor on the plurality of light-emitting devices;
   a reflective member forming step for forming a reflective member on the substrate strip to surround the phosphor;
   a support member forming step for forming a support member including an insulator and a wiring layer below the substrate strip to support the substrate strip; and
   a package singulation step for singulating unit packages by cutting the substrate strip and the reflective member,
   wherein the substrate strip has a plurality of pairs of a first electrode and a second electrode;
   wherein upper surfaces of the first electrode and the second electrode are coplanar with lower surfaces of the light-emitting device, the phosphor, and the reflective member, and
   wherein each of the unit packages formed by the support member forming step and the package singulator step comprises:
      a first cut surface on a side surface of the reflective member;
      a second cut surface on a side surface of the first electrode and the second electrode;
      a plurality of through electrodes, each of the through electrodes penetrating through the insulator to connect to each of the first electrode and the second electrode, respectively; and
      a plurality of rear wiring layers on the wiring layer, each of the rear wiring layers being connected to each of the through electrodes, respectively.

2. The method of claim 1, wherein, in the package singulation step, each of the first electrode and the second electrode is contacted with the light-emitting device, the phosphor and the reflective member.

3. The method of claim 1, wherein, in the package singulation step, a side surface and a bottom surface of the first electrode and the second electrode are exposed.

4. The method of claim 1, wherein, in the phosphor forming step, the phosphor is squeeze-printed on the substrate strip and the light-emitting devices using a mask.

5. The method of claim 1, wherein, in the reflective member forming step, reflective member accommodation cavities are formed by disposing a plate mold on an upper surface of the phosphor to surround the phosphor, and a molding material is filled in the reflective member accommodation cavities.

6. The method of claim 1, wherein, in the phosphor forming step, phosphor accommodation cavities are formed by disposing a mold on the light-emitting devices, and the phosphor is filled in the phosphor accommodation cavities.

7. The method of claim 1, wherein the phosphor forming step comprises a reflective member accommodation cavity forming step for forming reflective member accommodation cavities by cutting or etching parts of the phosphor.

8. The method of claim 7, wherein in the reflective member forming step, a molding material is filled in the reflective member accommodation cavities and the molding material is filled in a fluid state and then hardened into the reflective member.

9. The method of claim 1, wherein the package singulation step comprises a supporting member separation step for separating the substrate strip from the supporting member.

10. The method of claim 1, wherein the supporting member forming step comprises:
    a light-transmitting glass preparing step for preparing a light-transmitting glass;
    a UV adhesive coating step for coating a UV adhesive on the substrate strip and the light-transmitting glass to adhere the substrate strip to the light-transmitting glass; and
    a substrate strip fixing step for temporarily fixing the substrate strip onto the light-transmitting glass.

11. The method of claim 10, wherein the package singulation step comprises:
    a reflective member and substrate strip cutting step for cutting the reflective member and the substrate strip;
    a UV light projection step for projecting UV light onto the UV adhesive through the light-transmitting glass to eliminate an adhesive force of the UV adhesive; and
    a supporting member separation step for separating the substrate strip from the supporting member.

12. A light-emitting device package comprising:
    a substrate having a first electrode and a second electrode;
    a light-emitting devices mounted on the substrate;
    a phosphor provided on the light-emitting devices;
    a reflective member provided to surround the phosphor;
    a support member including an insulator and a wiring layer below the substrate to support the substrate;
    a first cut surface on a side surface of the reflective member;
    a second cut surface on a side surface of the first electrode and the second electrode;
    a plurality of through electrodes, each of the through electrodes penetrating through the insulator to connect to each of the first electrode and the second electrode, respectively; and
    a plurality of rear wiring layers on the wiring layer, each of rear wiring layers being connected to each of the through electrodes, respectively, wherein upper surfaces of the first electrode and the second electrode are coplanar with lower surfaces of the light-emitting device, the phosphor, and the reflective member.

13. The light-emitting device package of claim 12, wherein each of the first electrode and the second electrode is contacted with the light-emitting device, the phosphor and the reflective member.

14. The light-emitting device package of claim 12, wherein side surfaces of the first electrode and the second electrode are exposed.

15. The light-emitting device package of claim 12, further comprising:
   a third cut surface on a side surface of the support member; and
   a fourth cut surface on a side surface of the rear wiring layer,
   wherein the first cut surface, the second cut surface, the third cut surface, and the fourth cut surface are on the same plane.

16. The light-emitting device package of claim 15, wherein each of the through electrodes comprises a side electrode provided on the side surface of the supporting member and having the third cut surface, and wherein the first cut surface, the second cut surface, and the third cut surface are on the same plane.

* * * * *